United States Patent [19]

Leenerts

[11] 4,110,685

[45] Aug. 29, 1978

[54] STANDING WAVE RATIO MEASUREMENT INSTRUMENT

[76] Inventor: Virgil G. Leenerts, 1007 W. 30th St., Loveland, Colo. 80537

[21] Appl. No.: 738,163

[22] Filed: Nov. 1, 1976

[51] Int. Cl.² .................................................. G01R 27/04
[52] U.S. Cl. ................................. 324/58 B; 324/57 R; 324/98; 324/123 R
[58] Field of Search .............. 324/58 B, 58.5 B, 57 R, 324/98, 123 R, 127

[56] References Cited

U.S. PATENT DOCUMENTS

| | | | |
|---|---|---|---|
| 3,155,902 | 11/1964 | Walls | 324/57 R X |
| 3,369,128 | 2/1968 | Pearlman | 324/123 R X |
| 3,704,409 | 11/1972 | Oomen | 324/58 B X |
| 3,835,379 | 9/1974 | Templin | 324/58 B |
| 4,041,395 | 8/1977 | Hill | 324/58 B |

*Primary Examiner*—Stanley T. Krawczewicz
*Attorney, Agent, or Firm*—William E. Hein

[57] ABSTRACT

The output voltages produced by two directional couplers are applied to analog circuitry for generating a voltage that is directly proportional to return loss. An analog meter scale is calibrated to indicate return loss in decibel units and/or voltage standing wave ratio (VSWR) directly.

8 Claims, 3 Drawing Figures

2

STANDING WAVE RATIO MEASUREMENT INSTRUMENT

BACKGROUND AND SUMMARY OF THE INVENTION

This invention relates generally to the measurement of various electrical parameters associated with the transmission of radio frequency (RF) power and more particularly to the measurement of the voltage standing wave ratio (VSWR) at a selected point along a radio frequency transmission line. A typical radio frequency transmission system comprises a transmitter, an antenna, and a transmission line for coupling the transmitter to the antenna. In order to realize maximum power transfer from the transmitter to the antenna, it is necessary to properly match the impedance of those two system components. Measurement of the existing impedance match is generally effected by inserting two directional couplers in the transmission line. One of the directional couplers develops a voltage $E_f$ indicative of the forward power and the other develops a voltage $E_r$ indicative of the reflected power. The ratio $E_r/E_f$ defines a voltage reflection coefficient $\rho$. The voltage standing wave ratio (VSWR), a generally employed indication of the quality of the impedance match, is defined by the expression $VSWR = (1 + \rho)/(1 - \rho)$.

Certain known instruments for measuring forward and reflected power include the capability of measuring VSWR. However, the measurement of VSWR using these prior art instruments is cumbersome in that to do so variously requires side calculations, reference level setting, multiple meter movements, or conversion nomographs.

An improved standing wave ratio measurement instrument is described herein in which VSWR is continuously and automatically visually indicated to the user. In accordance with the illustrated preferred embodiment of the present invention two directional couplers are employed to produce voltages $E_f$ and $E_4$ that are indicative of the forward power and reflected power, respectively. Voltages $E_f$ and $E_r$ are applied to analog circuitry for generation of a voltage or current that is directly proportional to a parameter known as return loss ($RL_{dB}$). Return loss, expressed in decibel units, is defined by the expression $RL_{dB} = 20 \log(1/\rho) = 20 \log(E_f/E_r)$. Return loss is related to VSWR by the expression $RL_{dB} = 20 \log((VSWR + 1)/(VSWR - 1))$. An analog meter scale is calibrated to indicate return loss in decibel units and/or VSWR directly and continuously, thereby eliminating the requirement, in certain prior art instruments, of first setting a reference power level and then actuating a function switch to obtain an indication of VSWR.

Other and incidental advantages of this invention will become apparent to those persons skilled in the art from an examination of the following detailed description and the accompanying drawings.

DESCRIPTION OF THE PREFERRED EMBODIMENT

Figure 1:
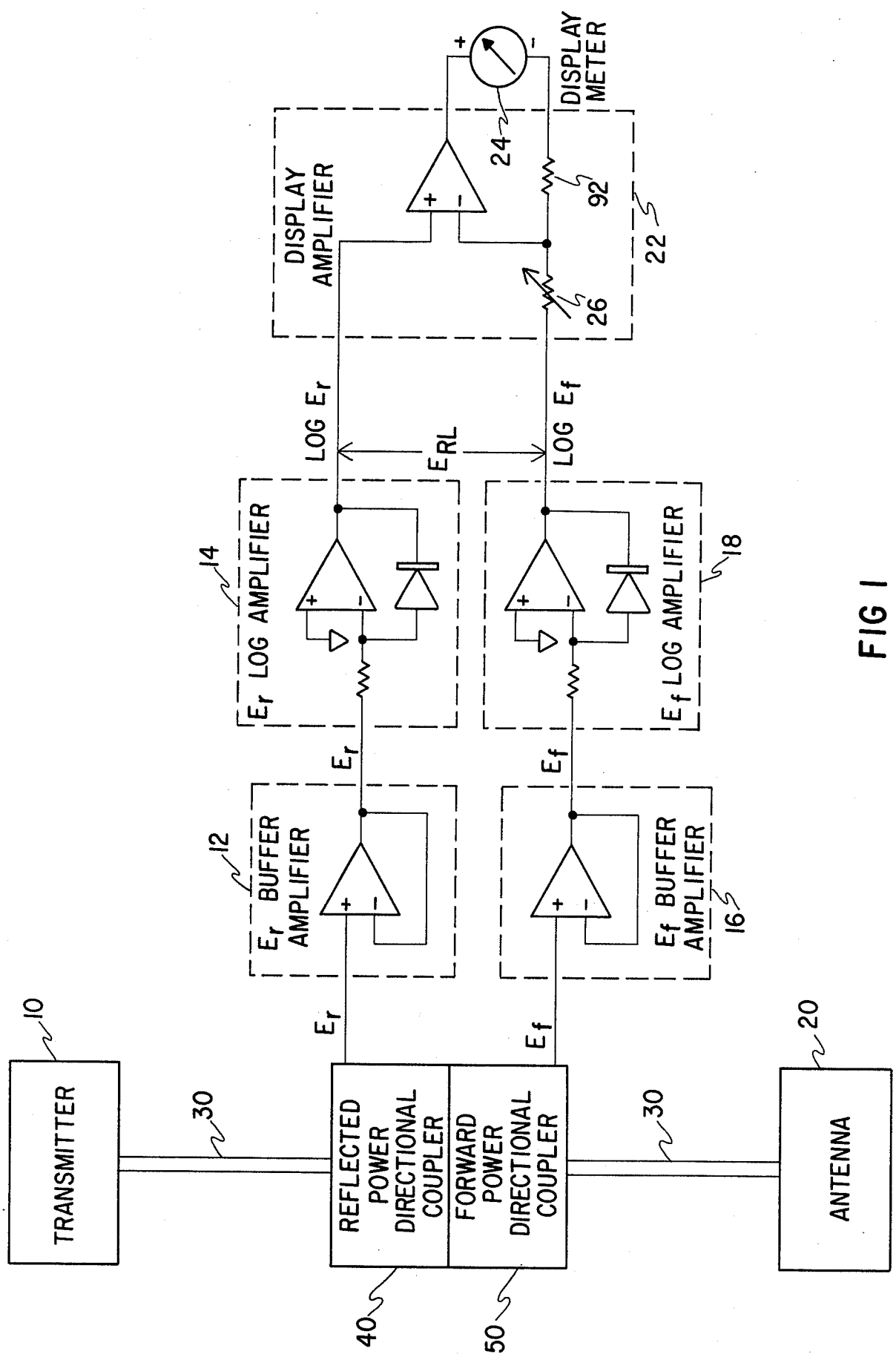
FIG. 1 is an overall block diagram of a typical RF power transmission system illustrating a VSWR measurement instrument in accordance with the preferred embodiment of the invention.
Figure 3:
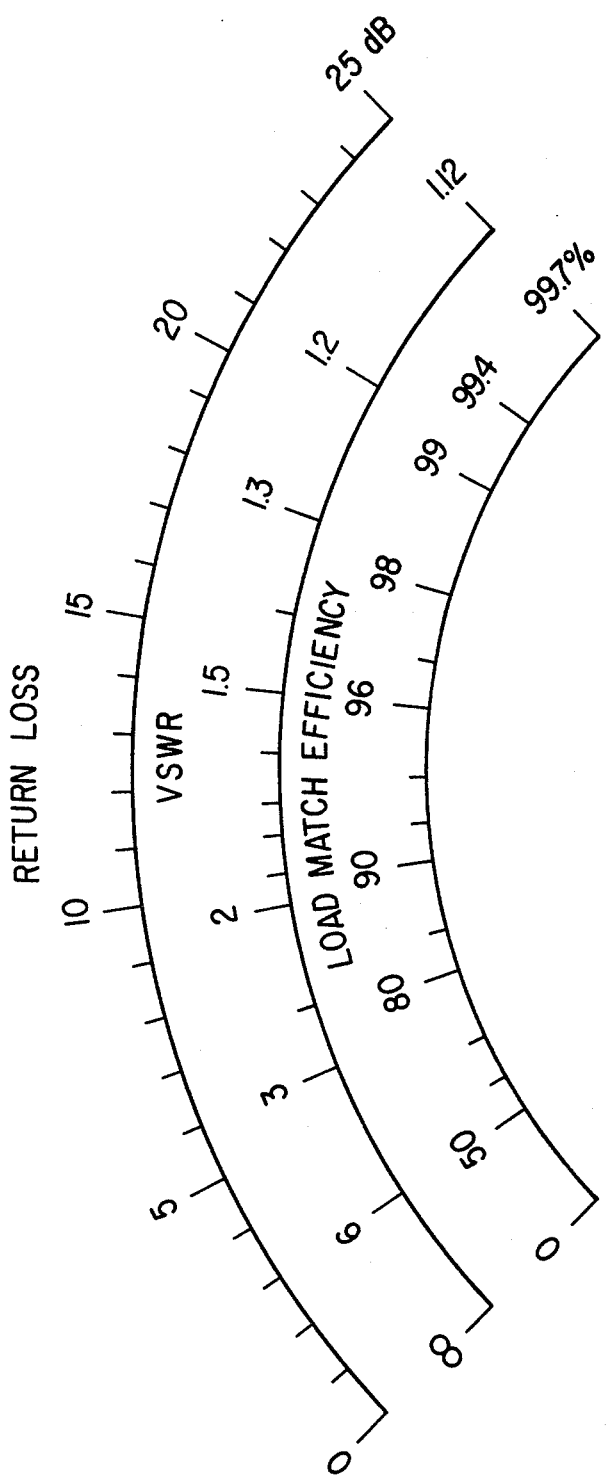
FIG. 3 is an illustration of a typical meter face including return loss, VSWR, and load match efficiency scales that may be employed in the VSWR measurement instrument of FIGS. 1 and 2.

Referring now to FIG. 1, there is shown a typical RF power transmission system that includes provision for measuring VSWR in accordance with the present invention. A source of RF power that may comprise a transmitter 10 is coupled to an antenna 20 via a transmission line 30. A pair of directional couplers 40 and 50 are inserted along transmission line 30 to provide voltages $E_r$ and $E_f$ indicative of reflected power and forward power, respectively, along transmission line 30. Directional couplers 40 and 50 may comprise any of a number of such devices that are commercially available as off-the-shelf components. The output $E_r$ of reflected power directional coupler 40 is applied to a buffer amplifier 12 that provides a low impedance source for a logarithmic amplifier 14. The output of log amplifier 14 is a voltage proportional to the logarithm of the voltage $E_r$. Similarly, the output $E_f$ of forward power directional coupler 50 is applied to a buffer amplifier 16 that is in turn coupled to a logarithmic amplifier 18. By well known definition, the return loss is related to the voltages $E_r$ and $R_f$ according to the expression $RL_{dB} = 20 \log E_f/E_r$. Therefore $RL_{dB} = 20 \log E_f - 20 \log E_r$. It is thus apparent that the difference of the outputs of log amplifiers 14 and 18 is a voltage or current that is proportional to the return loss $RL_{dB}$. The outputs of log amplifiers 14 and 18 are therefore applied to a display amplifies 22 that amplifiers the difference of the voltages log $E_r$ and log $E_f$ to drive an analog display meter 24. The current flowing through display meter 24 is proportional to the return loss $RL_{dB}$. The range or scale factor of display meter 24 may be set by means of a resistor 26 with known values of $E_r$ and $E_f$ applied to the inputs of buffer amplifiers 12 and 16 corresponding to a predetermined value of return loss or VSWR. Display meter 24 may contain one or more of the scales shown in FIG. 3, depending on the user's requirements. In addition to the display of return loss and VSWR, as discussed hereinabove, display meter 24 may include a scale for the display of a quantity known as load match efficiency. As illustrated in FIG. 3, this scale is calibrated in percent. Load match efficiency (LME) in percent is related to forward power $P_f$ and reflected power $P_r$ by the expression $LME\% = (P_f - P_r)(100)/P_f$. Load match efficiency is also related to return loss by the expression $RL_{dB} = 20 \log(100/(100 - LME\%))^{.5}$.

Figure 2:
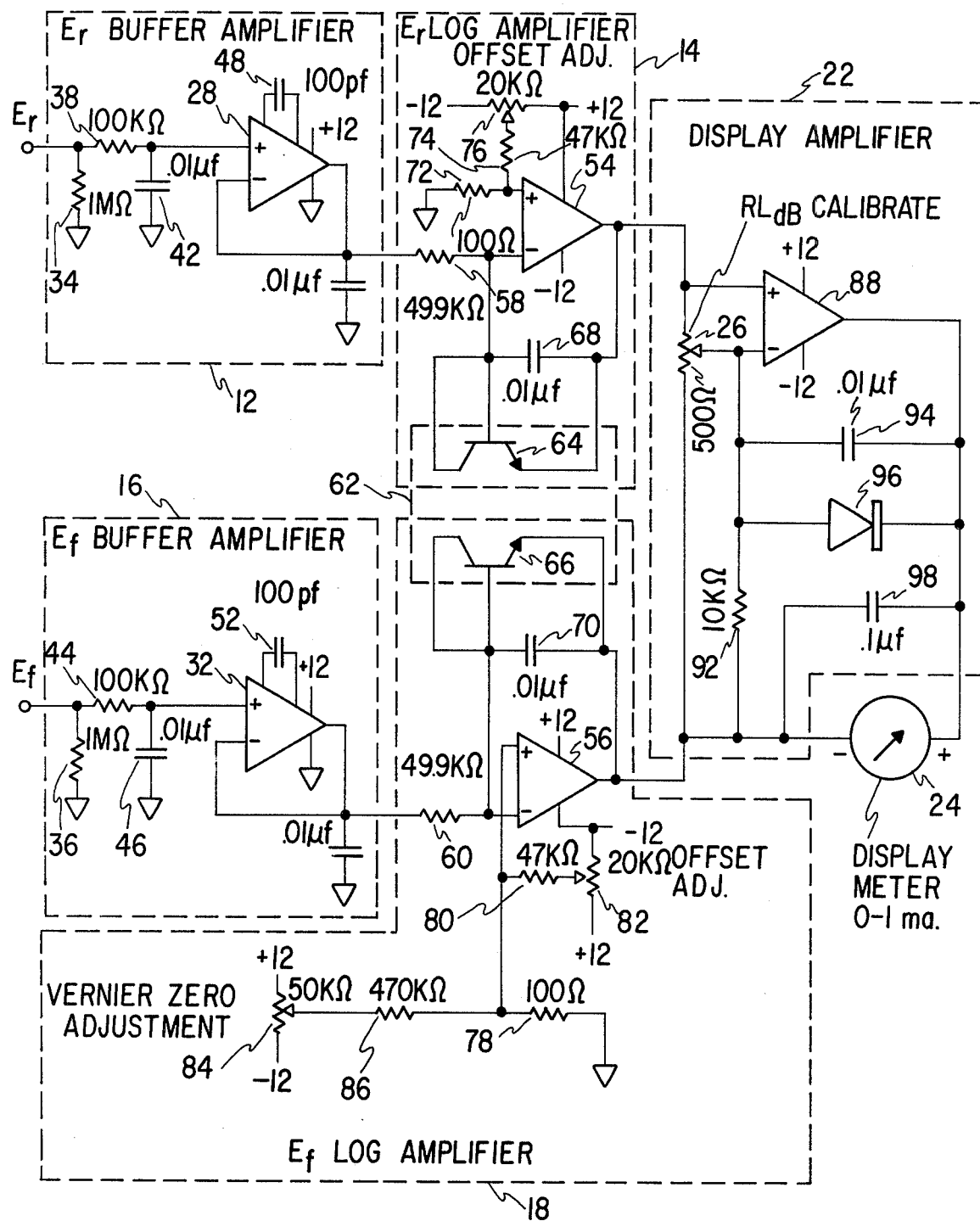
FIG. 2 is a detailed schematic diagram of the VSWR measurement instrument of FIG. 1.

Referring now to FIG. 2, there is shown a detailed schematic diagram of circuitry for implementing buffer amplifiers 12 and 16, log amplifiers 14 and 18, and display amplifier 22 of FIG. 1. Both of the buffer amplifiers 12 and 16 are arranged as voltage followers and may be constructed by employing a pair of operational amplifiers 28 and 32, such as te RCA CA3130, having a high impedance FET input. A pair of input resistors 34 and 36 serve to set the input impedance and provide bias current for operational amplifiers 28 and 32. Resistor-capacitor pairs 38-42 and 44-46 each form a low pass filter at the input of operational amplifiers 28 and 32. Capacitors 48 and 52 are employed as compensating capacitors for operational amplifiers 28 and 32.

Both of the logarithmic amplifiers 14 and 18 may be constructed by employing, for example, a pair of Fairchild µA714 operational amplifiers 54 and 56 connected in a common configuration. Resistors 58 and 60 serve as input resistors for log amplifiers 14 and 18. A transistor array 62, which may comprise a RCA CA3046 device, is connected to provide two diodes 64 and 66, one of which is associated with log amplifier 14 and the other of which is associated with log amplifier 18. Since diodes 64 and 66 reside within the same circuit package, they provide temperature tracking for the log amplifiers 14 and 18. A pair of capacitors 68 and 70 serve to compensate the response of operational amplifiers 54 and 56. A resistor network comprising resistors 72, 74, and 76 provides an offset voltage at the input of operational amplifier 54. This offset voltage establishes a quiescent current through resistor 58 in the absence of an input voltage. Resistor 76 is adjusted so that the output of log amplifier 14 is approximately approximately −0.45 volts when the input to buffer amplifier 12 is at ground potential. A similar resistor network comprising resistors 78, 80, and 82 is similarly employed in connection with operational amplifier 56. Logarithmic amplifier 18 includes a pair of resistors 84 and 86 to facilitate fine adjustments to the offset voltage applied to operational amplifier 56 by way of resistors 78, 80, and 82.

In order to initially calibrate the instrument, the inputs to buffer amplifiers 12 and 16 are grounded and the offset voltages at the outputs of log amplifiers 14 and 18 are both adjusted by means of resistors 76, 82, and 84, to be −0.45 volts. This results in a difference voltage $E_{RL}$, at the outputs of log amplifiers 14 and 18, equal to zero. Following this adjustment of the offset voltages the range of scale factor of display meter 24 is set in accordance with the procedure outlined hereinabove.

Display amplifier 22 may comprise, for example, a Fairchild μA741 operational amplifier 88 arranged in a common voltage gain amplifier configuration. A resistor 92 limits the current flow through display meter 24 in the event a measurement result exceeds the full scale indication of display meter 24. A capacitor 94 provides response compensation for operational amplifier 88. A diode 96 protects display meter 24 in the event a reverse meter current results from a particular measurement. A capacitor 98 merely provides RF bypassing of display meter 24.

After the initial calibration procedure set forth hereinabove has been completed, the standing wave ratio measurement instrument will automatically provide a continuous indication of the parameters for which separate scales are provided on display meter 24. As discussed above, the typical scales provided are those for indicating return loss, VSWR, and line match efficiency, or any combination thereof desired by the user. However, other scales may be provided by those persons skilled in the art to indicate additional parameters that can be expressed as a function of return loss.

It is anticipated that various modifications to the instrument herein described may be recognized by those persons skilled in the art while remaining within the scope of the present invention. For example, analog display meter 24 may be replaced with a display means for digitally indicating various measurement parameters to the user.

I claim:

1. In a radio frequency power transmission system in which radio frequency power is transferred from a source to a load via a transmission line, the combination comprising:
   directional coupler means connected along the transmission line for producing a first voltage indicative of the forward power conveyed by the transmission line and for producing a second voltage indicative of the reflected power conveyed by the transmission line;
   logarithmic amplifier means for receiving the first and second voltages and for producing a third voltage that is proportional to the difference between the logarithm of the first voltage and the logarithm of the second voltage; and
   analog display means connected to the logarithmic amplifier means for receiving the third voltage and for providing a visual indication of return loss to the user.

2. In a radio frequency power transmission system as in claim 1, the combination further comprising buffer amplifier means connected between the directional coupler means and the logarithmic amplifier means for providing a low impedance source for driving the logarithmic amplifier means.

3. In a radio frequency power transmission system as in claim 2 wherein the analog display means includes a display amplifier for amplifying the third voltage.

4. In a radio frequency power transmission system in which radio frequency power is transferred from a source to a load via a transmission line, the combination comprising:
   directional coupler means connected along the transmission line for producing a first voltage indicative of the forward power conveyed by the transmission line and for producing a second voltage indicative of the reflected power conveyed by the transmission lines;
   logarithmic amplifier means for receiving the first and second voltages and for producing a third voltage that is proportional to the difference between the logarithm of the first voltage and the logarithm of the second voltage; and
   analog display means connected to the logarithmic amplifier means for receiving the third voltage and for providing a visual indication of voltage standing wave ratio (VSWR) to the user.

5. In a radio frequency power transmission system in which radio frequency power is transferred from a source to a load via a transmission line, the combination comprising:
   directional coupler means connected along the transmission line for producing a first voltage indicative of the forward power conveyed by the transmission line and for producing a second voltage indicative of the reflected power conveyed by the transmission line;
   logarithmic amplifier means for receiving the first and second voltages and for producing a third voltage that is proportional to the difference between the logarithm of the first voltage and the logarithm of the second voltage; and
   analog display means connected to the logarithmic amplifier means for receiving the third voltage and for providing a visual indication of load match efficiency in percent to the user.

6. An analog instrument for measuring the quality of the match between a transmitter and a load coupled thereto by a transmission line, the instrument comprising:
   logarithmic amplifier means for receiving a first voltage $E_f$ indicative of the forward power conveyed by the transmission line, for receiving a second voltage $E_r$ indicative of the reflected power conveyed by the transmission line, and for producing a third voltage that is proportional to the logarithm of $(E_f/E_r)$; and analog display means connected to the logarithmic amplifier means for receiving the third voltage and for providing a visual indication of voltage standing wave ratio (VSWR) to the user.

7. An analog instrument as in claim 6 wherein the analog display means also provides a visual indication of return loss.

8. An analog instrument as in claim 6 wherein the analog display means also provides a visual indication of load match efficiency in percent.

* * * * *